United States Patent
Zhang et al.

(10) Patent No.: US 10,442,945 B2
(45) Date of Patent: Oct. 15, 2019

(54) CONDUCTIVE INK, DISPLAY SUBSTRATE AND FABRICATION METHOD THEREOF, AND DISPLAY APPARATUS

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Xujie Zhang, Beijing (CN); Ming Hu, Beijing (CN); Ming Zhang, Beijing (CN); Xiaodong Xie, Beijing (CN); Kongshuo Zhu, Beijing (CN); Yu Zhu, Beijing (CN)

(73) Assignees: BOE TECHNOLOGY GROUP CO., LTD., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 15/767,213

(22) PCT Filed: Dec. 13, 2017

(86) PCT No.: PCT/CN2017/115911
§ 371 (c)(1),
(2) Date: Apr. 10, 2018

(87) PCT Pub. No.: WO2018/176915
PCT Pub. Date: Oct. 4, 2018

(65) Prior Publication Data
US 2019/0085197 A1 Mar. 21, 2019

(30) Foreign Application Priority Data
Mar. 28, 2017 (CN) .......................... 2017 1 0192408

(51) Int. Cl.
*C09D 11/52* (2014.01)
*C09D 11/38* (2014.01)
(Continued)

(52) U.S. Cl.
CPC ........... *C09D 11/52* (2013.01); *B41M 7/0054* (2013.01); *C09D 11/033* (2013.01);
(Continued)

(58) Field of Classification Search
CPC ..... C09D 11/52; C09D 11/033; C09D 11/037; C09D 11/322; B41M 7/0054; H01B 1/04
(Continued)

(56) References Cited

U.S. PATENT DOCUMENTS

| 9,107,275 B2 * | 8/2015 | Magdassi ................. C23C 4/18 |
| 2010/0000441 A1 | 1/2010 | Jang et al. |
| 2014/0131079 A1 | 5/2014 | Byun |

FOREIGN PATENT DOCUMENTS

| CN | 103804996 A | 5/2014 |
| CN | 104177924 A | 12/2014 |

(Continued)

OTHER PUBLICATIONS

International Search Report & Written Opinion dated Feb. 9, 2018, regarding PCT/CN2017/115911.

*Primary Examiner* — Tremesha S Willis
(74) *Attorney, Agent, or Firm* — Intellectual Valley Law, P.C.

(57) ABSTRACT

A conductive ink includes a conductive nano-metal and a graphene dispersion liquid. The graphene dispersion liquid includes a graphene. A lateral size of the graphene is between approximately 0.1 micron and approximately 1 micron. The graphene has a weight percentage with respect to the conductive ink ranging from approximately 0.2 wt % to approximately 0.5 wt %.

19 Claims, 4 Drawing Sheets

(51) Int. Cl.
- *H05K 3/46* (2006.01)
- *H05K 1/09* (2006.01)
- *B41M 7/00* (2006.01)
- *C09D 11/033* (2014.01)
- *C09D 11/037* (2014.01)
- *C09D 11/322* (2014.01)
- *C09D 11/36* (2014.01)
- *H01B 1/04* (2006.01)
- *H01B 5/14* (2006.01)
- *H01B 13/00* (2006.01)
- *H05K 3/12* (2006.01)
- *G06F 3/041* (2006.01)

(52) U.S. Cl.
CPC .......... *C09D 11/037* (2013.01); *C09D 11/322* (2013.01); *C09D 11/36* (2013.01); *C09D 11/38* (2013.01); *H01B 1/04* (2013.01); *H01B 5/14* (2013.01); *H01B 13/0036* (2013.01); *H05K 1/097* (2013.01); *H05K 3/125* (2013.01); *H05K 3/1283* (2013.01); *H05K 3/46* (2013.01); *G06F 3/041* (2013.01); *G06F 2203/04103* (2013.01); *H05K 2201/0245* (2013.01); *H05K 2201/0323* (2013.01); *H05K 2201/0373* (2013.01); *H05K 2201/10128* (2013.01); *H05K 2201/10151* (2013.01)

(58) Field of Classification Search
USPC .......................................................... 174/253
See application file for complete search history.

(56) References Cited

FOREIGN PATENT DOCUMENTS

| | | |
|---|---|---|
| CN | 104893428 A | 9/2015 |
| CN | 105802346 A | 7/2016 |
| CN | 105936769 A | 9/2016 |
| CN | 106371686 A | 2/2017 |

\* cited by examiner

100

CONDUCTIVE INK, DISPLAY SUBSTRATE AND FABRICATION METHOD THEREOF, AND DISPLAY APPARATUS

CROSS-REFERENCE TO RELATED APPLICATION

This PCT patent application is a national stage application under 35 U.S.C. § 371 of International Application No. PCT/CN2017/115911, filed Dec. 13, 2017, which claims priority to Chinese Patent Application No. 201710192408.7, filed on Mar. 28, 2017, the entire contents of which are incorporated herein by reference.

TECHNICAL FIELD

The present disclosure generally relates to the field of display technologies and, more particularly, to a conductive ink, a display substrate and a fabrication method thereof, and a display apparatus.

BACKGROUND

Generally, a display panel includes a transparent electrode. For example, in a liquid crystal display panel, both a pixel electrode and a common electrode are transparent electrodes. In a touch panel, touch electrodes including a touch driving electrode and a touch sensing electrode are also transparent electrodes.

In conventional technologies, a transparent electrode is usually fabricated using indium-tin-oxide (ITO). However, the fabrication of the transparent electrode using ITO needs indium, which is a rare metal. In addition, a process of fabricating the transparent electrode needs high temperature and vacuum conditions. Thus, a cost is relatively high.

SUMMARY

In one aspect, the present disclosure provides a conductive ink including a conductive ink includes a conductive nano-metal and a graphene dispersion liquid. The graphene dispersion liquid includes a graphene. A lateral size of the graphene is between approximately 0.1 micron and approximately 1 micron. The graphene has a weight percentage with respect to the conductive ink ranging from approximately 0.2 wt % to approximately 0.5 wt %.

In some embodiments, the graphene dispersion liquid is a first slurry and the conductive ink further includes a slurry sub-material. The slurry sub-material and the conductive nano-metal form a conductive nano-metal slurry as a second slurry.

In some embodiments, the slurry sub-material includes one or more selected from a group consisting of acrylic acid, ethyl acetate, oleic acid, and ethanol.

In some embodiments, the slurry sub-material includes the acrylic acid, the ethyl acetate, the oleic acid, and the ethanol. The conductive nano-metal has a weight percentage with respect to the conductive nano-metal slurry ranging from approximately 0.5 wt % to approximately 4 wt %. The acrylic acid has a weight percentage with respect to the conductive nano-metal slurry ranging from approximately 0.2 wt % to approximately 1.7 wt %. The ethyl acetate has a weight percentage with respect to the conductive nano-metal slurry ranging from approximately 5 wt % to approximately 10 wt %. The oleic acid has a weight percentage with respect to the conductive nano-metal slurry ranging from approximately 2 wt % to approximately 5 wt %. The ethanol has a weight percentage with respect to the conductive nano-metal slurry ranging from approximately 80 wt % to approximately 90 wt %.

In some embodiments, the conductive nano-metal includes a nano-silver.

In some embodiments, the graphene dispersion liquid further includes ethanol, a dispersant, and water.

In some embodiments, the ethanol has a weight percentage with respect to the graphene dispersion liquid ranging from approximately 40 wt % to approximately 50 wt %. The graphene has a weight percentage with respect to the graphene dispersion liquid ranging from approximately 10 wt % to approximately 25 wt %. The dispersant has a weight percentage with respect to the graphene ranging from approximately 5 wt % to approximately 10 wt %. The water has a weight percentage with respect to the graphene dispersion liquid ranging from approximately 10 wt % to approximately 40 wt %.

In some embodiments, the dispersant includes sodium cholate.

Another aspect of the present disclosure provides a method for forming a pattern. The method includes printing ink droplets of the conductive ink over a to-be-patterned region of a substrate, adjacent ink droplets at least partially overlapping with each other; controlling solvent in the ink droplets to evaporate to turn the ink droplets into annular conductive rings to form an initial electrode pattern in the to-be-patterned region; and drying the initial electrode pattern to form a final electrode pattern. The adjacent conductive rings intersect each other.

In some embodiments, drying the initial electrode pattern includes sintering the initial electrode pattern at a temperature for a period of time.

In some embodiments, the temperature ranges from approximately 120° C. to approximately 150° C.

In some embodiments, the period of time ranges from approximately 1.5 hours to approximately 3 hours.

In some embodiments, diameters of the ink droplets range from approximately 100 μm to approximately 200 μm.

In some embodiments, a distance between geometric centers of two adjacent ink droplets is between approximately 50 μm and approximately 60 μm.

In some embodiments, the final electrode pattern includes a touch electrode pattern.

Another aspect of the present disclosure provides a display substrate including a final electrode pattern. The final electrode pattern includes a plurality of conductive rings intersecting each other. A material of the conductive rings includes a nano-metal and a graphene, and line widths of the conductive rings are between approximately 2 μm and approximately 7 μm.

In some embodiments, maximum sizes of the conductive rings are between approximately 100 μm and 200 μm.

In some embodiments, a distance between centers of two adjacent conductive rings is between approximately 50 μm and approximately 60 μm.

Another aspect of the present disclosure provides a display apparatus including a display substrate.

BRIEF DESCRIPTION OF THE FIGURES

The following drawings are merely examples for illustrative purposes according to various disclosed embodiments and are not intended to limit the scope of the present disclosure.

Figure 1:
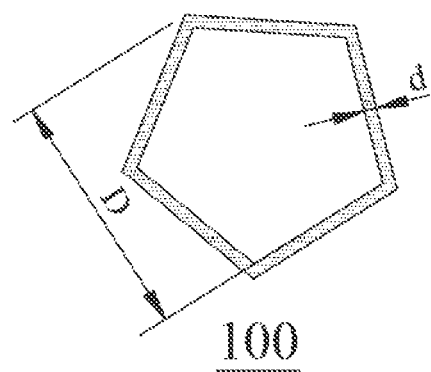
FIG. 1 illustrates a schematic view of an exemplary conductive ring according to various disclosed embodiments of the present disclosure.

Reference numerals used in the drawings include: 100, conductive ring; 400, display substrate; 401, final electrode pattern; 500, display apparatus; 501, display substrate; and 502, display panel.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

The present disclosure provides a conductive ink. The conductive ink may include a mixture including a conductive nano-metal slurry and a graphene dispersion liquid. The conductive nano-metal slurry may include a slurry sub-material and a conductive nano-metal suspended in the slurry sub-material. The graphene dispersion liquid may include a graphene. A lateral size of the graphene may be between approximately 0.1 microns and approximately 1 micron. The graphene is a 2-dimensional material in 2-dimensional plane. The graphene may have a thickness along a direction perpendicular to the 2-dimensional plane, and lateral dimensions, i.e., in-plane dimensions, along the 2-dimensional plane. The lateral size of the graphene may be a size for representing the lateral dimensions of the graphene, and may be determined according to the lateral dimensions of the graphene. In some embodiments, the graphene may have a lateral shape of a rectangle, and correspondingly, the lateral size may be equal to an average of a width and a length of the rectangle. In some other embodiments, the graphene may have a lateral shape of a circle, and correspondingly, the lateral size may be equal to a diameter of the circle. The lateral shape of the graphene may be a square, a rectangle, a circle, or another suitable shape. In the present disclosure, the lateral shape of the graphene is not restricted. A percentage of the graphene in the conductive ink may range from approximately 0.2 wt %, i.e., 0.2% by weight, to approximately 0.5 wt %, i.e., 0.5% by weight.

In some other embodiments, the conductive ink may include a conductive nano-metal and a graphene dispersion liquid. For the graphene dispersion liquid, reference can be made to the above descriptions, which are not repeated here.

When a liquid droplet is formed over a solid body, if solid particles exist in the liquid, the solid particles may affect a flow direction and a flow rate of the liquid, such that a liquid stain formed after the liquid droplet is dry may have a darker color in a periphery than in a center, which is referred to as a "coffee ring effect." In the present disclosure, solid particles in the conductive ink may include a conductive nano-metal and graphene. Thus, when the conductive ink is printed over a substrate in a form of ink droplets, an evaporation rate of solvent at a periphery of an ink droplet may be greater than an evaporation rate of solvent at a center of the ink droplet due to the coffee ring effect. As a result, an outward capillary flow of the solvent in the ink droplet may carry nano-metal particles suspended in the ink droplet to the periphery of the ink droplet, and nano-metal particles may deposit at the periphery to form a conductive ring. The conductive nano-metal slurry may be diluted to a certain extent by adding the graphene dispersion liquid to the conductive ink. FIG. 1 illustrates a schematic view of an exemplary conductive ring according to various disclosed embodiments of the present disclosure. A line width d of a conductive ring shown in FIG. 1 may range from approximately 2 μm to approximately 7 μm. Since the line width d of each conductive ring 100 is between approximately 2 μm and approximately 7 μm in a final electrode, the conductive ring may have a relatively good hiding effect under light irradiation. That is, the conductive ring 100 may have a relatively high light transmittance.

The graphene may have a relatively good electrical property, and may be in a form of spreading sheet. When graphene is used in combination with nano-metal particles, the graphene may serve as links between nano-metal particles, reducing gaps between the conductive nano-metal particles. Accordingly, a stacking density of the conductive film layer may be increased, and contact areas between individual particles may be increased, thereby improving au electrical property of the conductive ring.

Accordingly, the conductive ring 100 may have a relatively high light transmittance and a relatively good electrical conductivity.

Figure 2:
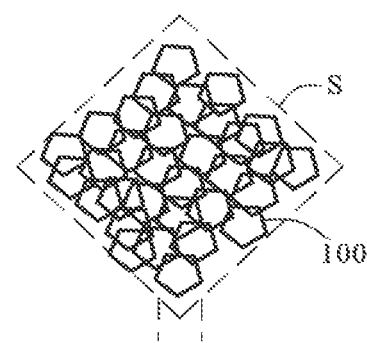
FIG. 2 illustrates a schematic view of an exemplary final electrode formed by ink-jet printing according to various disclosed embodiments of the present disclosure.

FIG. 2 illustrates a schematic view of an exemplary final electrode formed by ink-jet printing according to various disclosed embodiments of the present disclosure. When a final electrode is formed by ink-jet printing, as shown in FIG. 2, the conductive ink is printed in a form of ink droplets in a region S having a predetermined shape. The shape of the region S can be, for example, a shape of a pixel electrode or a shape of a touch electrode. A plurality of ink droplets are printed in the region S, and overlapping portions exist between adjacent ink droplets. That is, adjacent ink droplets at least partially overlap with each other. After the solvent in the ink droplets evaporates, the coffee ring effect may occur in the ink droplets. Thus, interconnected conductive rings 100 may be formed after the ink droplets are dried.

As noted above, the conductive ring may have a relatively good hiding effect and a good electrical conductivity. The electrode formed in the region S may have a relatively good light transmittance and a good electrical conductivity. As compared to the conventional photolithography process, the process of forming the electrode by ink-jet printing the conductive ink may be less complicated and thus relatively easy to realize. Therefore, a fabrication of a display substrate using the conductive ink may have a relatively low cost.

In order to improve the electrical conductivity of the conductive ring, in some embodiments, the metal in the conductive nano-metal slurry may include, for example, a nano-silver. In some embodiments, the conductive nano-metal slurry may include, for example, a commercially available conductive silver paste.

In the present disclosure, ingredients of the graphene dispersion liquid are not restricted. In some embodiments, ingredients of the graphene dispersion liquid can be selected, such that the graphene can be uniformly dispersed in the graphene dispersion liquid. The sum of mass percentages, i.e., weight percentages, of all the ingredients of the graphene dispersion liquid is 100%. In some embodiments, the graphene dispersion liquid may include, for example, ethanol, graphene, dispersant, and water. The ethanol may have a weight percentage with respect to a total weight of the graphene dispersion liquid ranging from approximately 40 wt % to approximately 50 wt %. The graphene may have a weight percentage with respect to the total weight of the graphene dispersion liquid ranging from approximately 10 wt % to approximately 25 wt %. A weight of the dispersant may be approximately 5% to approximately 10% of a weight of the graphene. The water may have a weight percentage with respect to the total weight of the graphene dispersion liquid ranging from approximately 10 wt % to approximately 40 wt %. The graphene dispersion liquid may also be considered as a slurry.

In the present disclosure, ingredients of the dispersant are not restricted. For example, the ingredients of the dispersant can include, for example, sodium cholate.

In the present disclosure, ingredients of the conductive nano-metal slurry are not restricted. The conductive nano-metal slurry can include, for example, a commercially-available conductive silver paste, or a conductive nano-metal slurry obtained according to a preparation method. In order to obtain a conductive nano-metal slurry having an appropriate fluidity, in some embodiments, the slurry sub-material may include, for example, one or more selected from a group including acrylic acid, ethyl acetate, oleic acid, and ethanol. In some embodiments, the conductive nano-metal slurry may include, for example, conductive nano-metal, acrylic acid, ethyl acetate, oleic acid, and ethanol. The conductive nano-metal may have a weight percentage with respect to a total weight of the conductive nano-metal slurry ranging from approximately 0.5 wt % to approximately 4 wt %. The acrylic acid may have a weight percentage with respect to a total weight of the conductive nano-metal slurry ranging from approximately 0.2 wt % to approximately 1.7 wt %. The ethyl acetate may have a weight percentage with respect to a total weight of the conductive nano-metal slurry ranging from approximately 5 wt % to approximately 10 wt %. The oleic acid may have a weight percentage with respect to a total weight of the conductive nano-metal slurry ranging from approximately 2 wt % to approximately 5 wt %. The ethanol may have a weight percentage with respect to a total weight of the conductive nano-metal slurry ranging from approximately 80 wt % to approximately 90 wt %.

In the present disclosure, ingredients of the conductive nano-metal are not restricted. In order to improve the electrical conductivity, in some embodiments, the conductive nano-metal may include, for example, a nano-silver. Accordingly, the conductive nano-metal shiny may include, for example, a conductive silver paste.

Figure 3:
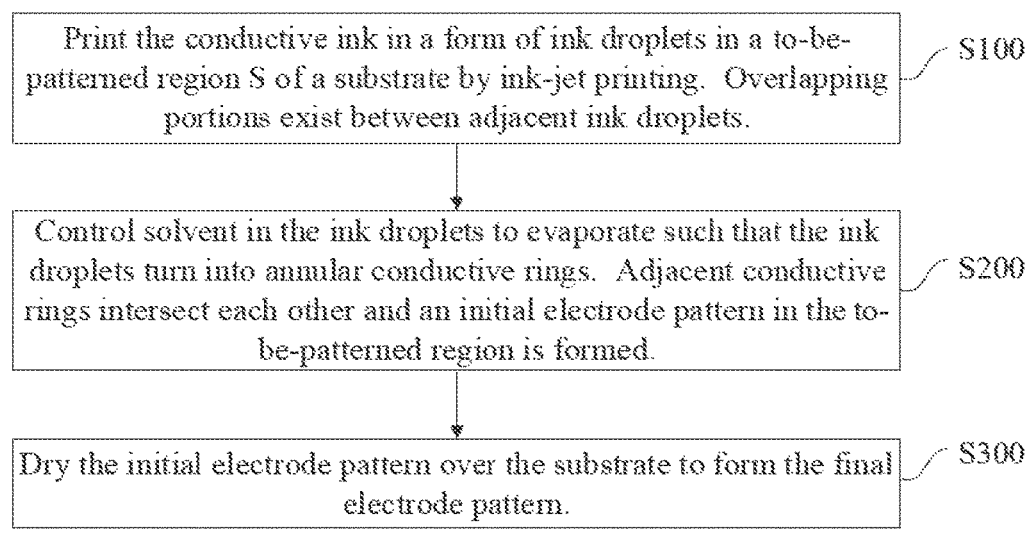
FIG. 3 illustrates a flow chart of an exemplary method for forming a pattern according to various disclosed embodiments of the present disclosure.

The present disclosure provides a method for forming a pattern. FIG. 3 illustrates a flow chart of an exemplary method for forming a pattern according to various disclosed embodiments of the present disclosure. With reference to FIG. 3, the method is described below.

At S100, the conductive ink is printed in a form of ink droplets in a to-be-patterned region S of a substrate by ink-jet printing. Overlapping portions exist between adjacent ink droplets. That is, adjacent ink droplets at least partially overlap with each other. The conductive ink includes the above-described conductive ink consistent with the present disclosure.

At S200, solvent in the ink droplets is controlled to evaporate such that the ink droplets turn into annular conductive rings. Adjacent conductive rings intersect each other and an initial electrode pattern in the to-be-patterned region is formed.

At S300, the initial electrode pattern over the substrate is dried to form the final electrode pattern.

As described above, the conductive ink consistent with the present disclosure may have a low concentration of nano-silver particles, such that a relatively thin conductive ring 100 can be formed. Further, a graphene in the conductive ink can enhance a conductivity of the conductive ring 100. Thus, the final electrode pattern prepared by the fabrication method may have a relatively high light transmittance and a relatively high electrical conductivity. In addition, as compared with the conventional photolithography process, in the present disclosure, the ink-jet printing method may have a less complicated process, and thus may be easier to realize. The fabrication method consistent with the present disclosure may have a relatively low process cost.

The process of S200 may include evaporating the solvent in the ink droplets. The process of S300 may include further evaporating the solvent in the initial electrode pattern and causing the final electrode pattern to have a relatively high strength, such that the final electrode pattern may be firmly bonded to the substrate.

In the present disclosure, the manner of drying the initial electrode pattern over the substrate is not restricted. For example, the process of S300 may include, for example, sintering the initial electrode pattern over the substrate at a temperature for a period of time.

By sintering, the solvent can be further evaporated, and the electrode pattern can be further fixed, such that the final electrode pattern can be firmly fixed to the substrate.

In some embodiments, the temperature may range from approximately 120° C. to approximately 150° C.

In some embodiments, the period of time may range from approximately 1.5 hours to approximately 3 hours.

In the present disclosure, a diameter of the final electrode may be between approximately 100 μm and approximately 200 μm. In some embodiments, at S100, a diameter of an ejected ink droplet may range from approximately 100 μm to approximately 200 μm.

In the present disclosure, a final shape of the final electrode pattern may be determined by a shape of the to-be-patterned region. In some embodiments, the final electrode pattern may include, for example, a pixel electrode pattern. In some other embodiments, the final electrode pattern may include, for example, a touch electrode pattern. In the examples shown in FIG. 1 and FIG. 2, the final electrode pattern may include a touch electrode pattern.

The present disclosure provides a display substrate. The display substrate can be formed by a fabrication method including the above-described method for forming a pattern consistent with the disclosure.

Figure 4:
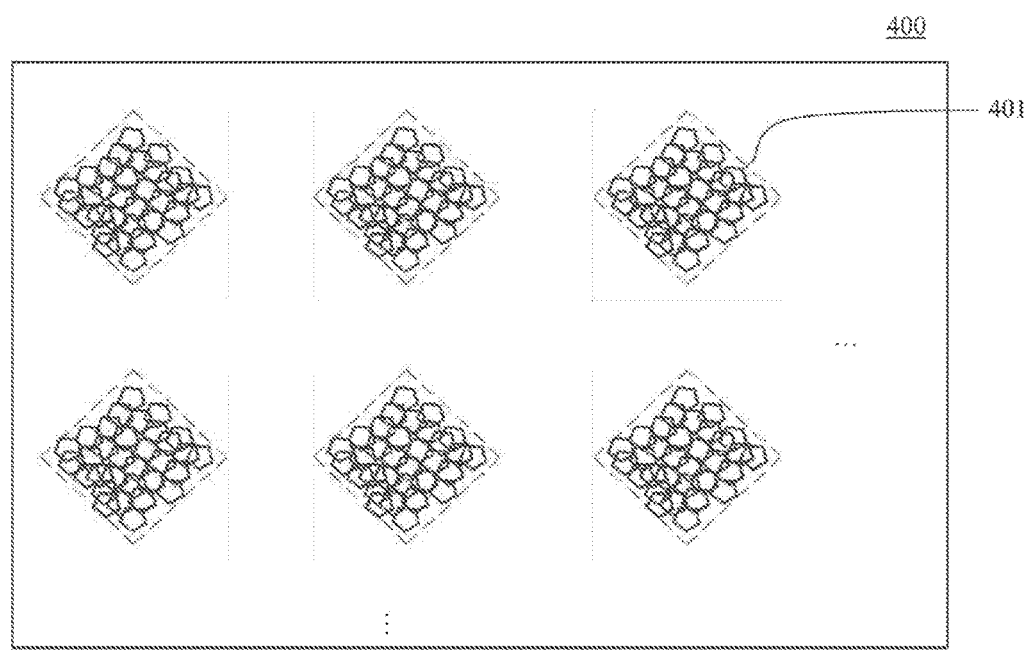
FIG. 4 illustrates a schematic view of an exemplary display substrate according to various disclosed embodiments of the present disclosure.

In some embodiments, the display substrate may include a final electrode pattern. FIG. 4 illustrates a schematic view of an exemplary display substrate 400 according to various disclosed embodiments of the present disclosure. As shown in FIG. 4, the display substrate 400 includes a final electrode pattern 401. The final electrode pattern 401 includes a plurality of conductive rings intersecting each other. The final electrode pattern 401 can be any one of final electrodes consistent with the present disclosure. Any display substrate including a final electrode consistent with the disclosure is within the scope of the present disclosure.

A material of the conductive ring may include, for example, a mixture including a nano-metal and a graphene. The conductive ring may have a line width between approximately 2 μm and approximately 7 μm.

A maximum on-ring size of the conductive ring may be between approximately 100 μm and 200 μm.

A distance between centers, i.e., geometric centers, of two adjacent ink droplets may range from approximately 50 μm to approximately 60 μm. Accordingly, a distance between centers of two adjacent conductive rings may range from approximately 50 μm to approximately 60 μm.

The final electrode in the display substrate can include, for example, any one of a common electrode, a pixel electrode, or a touch electrode.

The display substrate may include, for example, an array substrate. Accordingly, final electrodes may include a pixel electrode, a common electrode, or both a pixel electrode and a common electrode.

The display substrate may include a touch substrate, and accordingly the final electrode may include a touch electrode. Touch electrodes may include a touch driving electrode and a touch sensing electrode. Final electrodes may include a touch driving electrode, a touch sensing electrode, or both a touch driving electrode and a touch sensing electrode.

Figure 5:
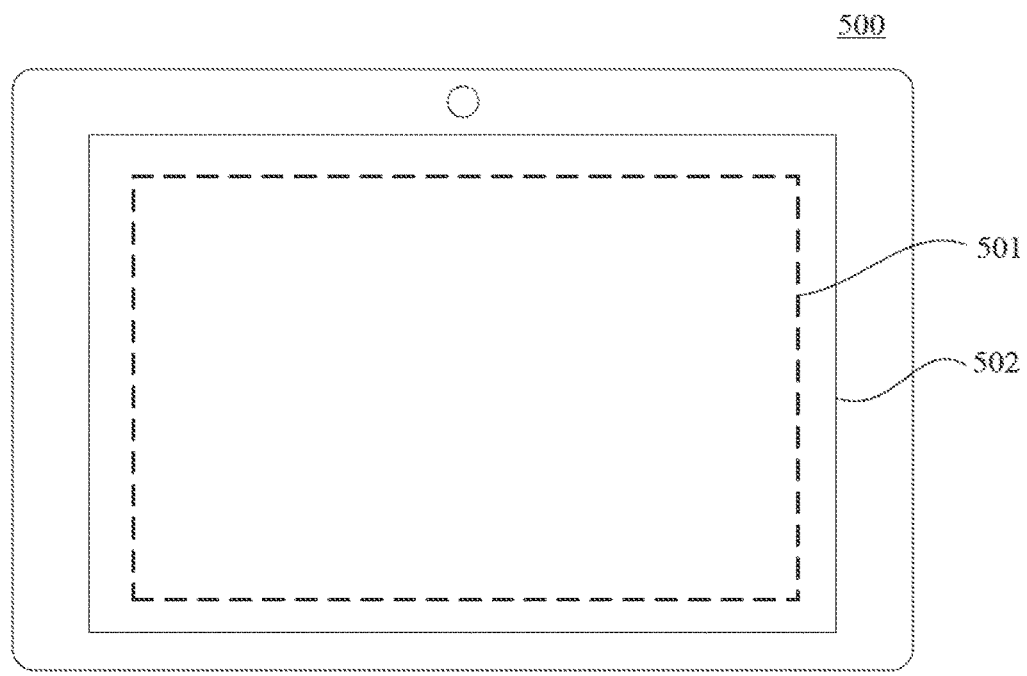
FIG. 5 illustrates a schematic view of an exemplary display apparatus according to various disclosed embodiments of the present disclosure.

The present disclosure provides a display apparatus. The display apparatus may include the display substrate consistent with the present disclosure. FIG. 5 illustrates a schematic view of an exemplary display apparatus 500 according to various disclosed embodiments of the present disclosure. As shown in FIG. 5, the display apparatus 500 includes a display substrate 501 consistent with the disclosure. The display substrate 501 can be, for example, any one of the above-described exemplary display substrates, such as the above-described display substrate 400. In addition to the display substrate 501, the display apparatus 500 may further include other suitable structures. For example, as shown in FIG. 5, the display apparatus includes a display panel 502, which further includes the display substrate 501. The display apparatus 500 can be, for example, an electronic paper, an organic light-emitting diode (OLED) panel, a mobile phone, a tablet computer, a television, a monitor, a notebook computer, a digital photo flame, a navigator, or any suitable product or component having a display function. Any display apparatus including a display substrate consistent with the disclosure is within the scope of the present disclosure.

The final electrode in the display apparatus may have a high light transmittance and a better electrical conductivity, and thus, the display apparatus can display a relatively clear image. In addition, the display apparatus may have a relatively low fabrication cost.

The conductive ink can be prepared, for example, by the following methods, as illustrated in Preparation Examples shown below.

Preparation Example 1 is described below.

At S1, a graphene dispersion liquid is prepared. The process of S1 may include S11 and S12.

At S11, 10 g, i.e., 10 grams, of graphene, 40 g of water, 49.5 g of ethanol, and 0.5 g of sodium cholate dispersant are weighted and prepared, respectively.

At S12, the ethanol, the graphene, and the sodium cholate dispersant are successively added to the water and stirred to be uniform, to form the graphene dispersion liquid.

At S2, 4900 g of commercially available conductive silver paste is weighted and prepared to serve as a conductive nano-metal slurry.

At S3, the conductive nano-metal slurry and the graphene dispersion liquid are mixed to form a conductive ink.

Preparation Example 2 is described below.

At S11, 25 g of graphene, 40 g of water, 32.5 g of ethanol, and 2.5 g of sodium cholate dispersant are weighted and prepared, respectively.

At S12, the ethanol, the graphene, and the sodium cholate dispersant are successively added to the water and stirred to be uniform, to form the graphene dispersion liquid.

At S2, 4900 g of commercially available conductive silver paste is weighted and prepared to serve as a conductive nano-metal slurry.

At S3, the conductive nano-metal slurry and the graphene dispersion liquid are mixed to form a conductive ink.

The final electrodes can be formed, for example, by the following methods, as illustrated in Examples below.

Example 1, i.e., Example 1 of the disclosure, is described below.

At S100, the conductive ink formed in Preparation Example 1 is printed in a form of ink droplets in a to-be-patterned region S of a substrate by ink-jet printing. Adjacent ink droplets have overlapping portions. That is, adjacent ink droplets at least partially overlap with each other. The ink droplet has a diameter of approximately 100 μm.

At S200, solvent in the ink droplets is controlled to evaporate such that the ink droplets turn into annular conductive rings. Adjacent conductive rings intersect each other and an initial electrode pattern in the to-be-patterned region is formed.

At S300, the initial electrode pattern over the substrate is sintered at a temperature of approximately 120° C. for approximately 3 hours to form the final electrode pattern.

Example 2, i.e., Example 2 of the disclosure, is described below.

At S100, the conductive ink formed in Preparation Example 2 is printed in a form of ink droplets in a to-be-patterned region S of a substrate by ink-jet printing. Adjacent ink droplets have overlapping portions. That is, adjacent ink droplets at least partially overlap with each other. The ink droplet has a diameter of approximately 200 μm.

At S200, solvent in the ink droplets is controlled to evaporate such that the ink droplets turn into annular conductive rings. Adjacent conductive rings intersect each other and an initial electrode pattern in the to-be-patterned region is formed.

At S300, the initial electrode pattern over the substrate is sintered at a temperature of approximately 150° C. for approximately 2 hours to form the final electrode pattern.

According to tests, a line width of the conductive ring of Example 1 is approximately 5 μm. A line width of the conductive ring of Example 2 is approximately 7 μm.

The present disclosure provides a conductive ink. The conductive ink may include a mixture including a conductive nano-metal shiny and a graphene dispersion liquid. The graphene dispersion liquid may include a graphene having a lateral size of approximately 0.1 μm to approximately 1 μm. A mass percentage (weight percentage) of the graphene in the conductive ink may range from approximately 0.2% to approximately 0.5%. The present disclosure further provides a fabrication method for a display substrate, a display substrate, and a display apparatus. The fabrication method may have a relatively less demanding process, and thus a relatively low process cost. Further, the display substrate fabricated by fabrication method may have a relatively good light transmittance and a relatively good conductivity.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A conductive ink comprising:
 a conductive nano-metal; and
 a graphene dispersion liquid including a graphene, wherein:
  a lateral size of the graphene is between 0.1 micron and 1 micron, and
  the graphene has a weight percentage with respect to the conductive ink ranging from approximately 0.2 wt % to approximately 0.5 wt %;
 wherein the conductive ink further comprises acrylic acid, ethyl acetate, and oleic acid.

2. The conductive ink according to claim 1,
 wherein the graphene dispersion liquid is a first slurry, the conductive ink further comprising:
  a slurry sub-material,
  wherein the slurry sub-material and the conductive nano-metal form a conductive nano-metal slurry as a second slurry.

3. The conductive ink according to claim 2, wherein the slurry sub-material includes one or more selected from a group consisting of acrylic acid, ethyl acetate, oleic acid, and ethanol.

4. The conductive ink according to claim 3, wherein:
 the slurry sub-material includes the acrylic acid, the ethyl acetate, the oleic acid, and the ethanol,
 the conductive nano-metal has a weight percentage with respect to the conductive nano-metal slurry ranging from approximately 0.5 wt % to approximately 4 wt %,
 the acrylic acid has a weight percentage with respect to the conductive nano-metal slurry ranging from approximately 0.2 wt % to approximately 1.7 wt %,
 the ethyl acetate has a weight percentage with respect to the conductive nano-metal slurry ranging from approximately 5 wt % to approximately 10 wt %,
 the oleic acid has a weight percentage with respect to the conductive nano-metal slurry ranging from approximately 2 wt % to approximately 5 wt %, and
 the ethanol has a weight percentage with respect to the conductive nano-metal slurry ranging from approximately 80 wt % to approximately 90 wt %.

5. The conductive ink according to claim 1, wherein the conductive nano-metal includes a nano-silver.

6. The conductive ink according to claim 1, wherein the graphene dispersion liquid further includes ethanol, a dispersant, and water.

7. The conductive ink according to claim 6, wherein:
 the ethanol has a weight percentage with respect to the graphene dispersion liquid ranging from approximately 40 wt % to approximately 50 wt %,
 the graphene has a weight percentage with respect to the graphene dispersion liquid ranging from approximately 10 wt % to approximately 25 wt %,
 the dispersant has a weight percentage with respect to the graphene ranging from approximately 5 wt % to approximately 10 wt %, and
 the water has a weight percentage with respect to the graphene dispersion liquid ranging from approximately 10 wt % to approximately 40 wt %.

8. The conductive ink according to claim 6, wherein the dispersant includes sodium cholate.

9. A method for forming a pattern, comprising:
 printing ink droplets of the conductive ink according to claim 1 over a to-be-patterned region of a substrate, adjacent ink droplets at least partially overlapping with each other;
 controlling solvent in the ink droplets to evaporate to turn the ink droplets into annular conductive rings to form an initial electrode pattern in the to-be-patterned region, adjacent conductive rings intersecting each other; and
 drying the initial electrode pattern to form a final electrode pattern.

10. The method according to claim 9, wherein drying the initial electrode pattern includes:
 sintering the initial electrode pattern at a temperature for a period of time.

11. The method according to claim 10, wherein the temperature ranges from approximately 120° C. to approximately 150° C.

12. The method according to claim 10, wherein the period of time ranges from approximately 1.5 hours to approximately 3 hours.

13. The method according to claim 9, wherein diameters of the ink droplets range from approximately 100 μm to approximately 200 μm.

14. The method according to claim 13, wherein a distance between geometric centers of two adjacent ink droplets is between approximately 50 μm and approximately 60 μm.

15. The method according to claim 9, wherein the final electrode pattern includes a touch electrode pattern.

16. A display substrate comprising:
 the final electrode pattern fabricated by the method of claim 9, the final electrode pattern including a plurality of conductive rings intersecting each other,
 wherein:
  a material of the conductive rings includes a nano-metal and a graphene, and
  line widths of the conductive rings are between approximately 2 μm and approximately 7 μm.

17. The display substrate according to claim 16, wherein maximum sizes of the conductive rings are between approximately 100 μm and 200 μm.

18. The display substrate according to claim 16, wherein a distance between centers of two adjacent conductive rings is between approximately 50 μm and approximately 60 μm.

19. A display apparatus comprising the display substrate according to claim 16.

* * * * *